United States Patent [19]
Gnade et al.

[11] Patent Number: 5,561,318
[45] Date of Patent: Oct. 1, 1996

[54] POROUS COMPOSITES AS A LOW DIELECTRIC CONSTANT MATERIAL FOR ELECTRONICS APPLICATIONS

[75] Inventors: Bruce E. Gnade, Dallas; Chih-Chen Cho, Richardson, both of Tex.; Douglas M. Smith, Albuquerque, N.M.

[73] Assignee: Texas Instruments Incorporated, Dallas, Tex.

[21] Appl. No.: 477,029

[22] Filed: Jun. 7, 1995

Related U.S. Application Data

[62] Division of Ser. No. 255,157, Jun. 7, 1994, Pat. No. 5,494,858.

[51] Int. Cl.$^6$ .................................................. H01L 23/58
[52] U.S. Cl. ........................................ 257/638; 257/637
[58] Field of Search .................................. 257/632, 637, 257/638, 642, 643, 758, 759, 760

[56] References Cited

U.S. PATENT DOCUMENTS

| | | | |
|---|---|---|---|
| 4,652,467 | 3/1987 | Brinker et al. | 427/246 |
| 4,987,101 | 1/1991 | Kaanta et al. | 437/235 |
| 5,103,288 | 4/1992 | Sakamoto et al. | 357/71 |
| 5,155,576 | 10/1992 | Mizushima | 357/71 |
| 5,393,712 | 2/1995 | Rostoker et al. | 437/238 |

*Primary Examiner*—Sara W. Crane
*Assistant Examiner*—Alice W. Tang
*Attorney, Agent, or Firm*—James E. Harris; Richard A. Stoltz; Richard L. Donaldson

[57] ABSTRACT

This invention provides a process for making a semiconductor device with reduced capacitance between adjacent conductors. This process can include applying and gelling one or more solutions between and over conductors 24 and drying the wet gel to create at least porous dielectric sublayers 28 and 29. By varying the composition of the solutions, gelling conditions, drying temperature, composition of the solvents in the wet gel, or a combination of these approaches, the porosity of the sublayers may be tailored individually. A non-porous dielectric layer 30 may be formed over porous layer 28, which may complete an interlayer dielectric. A novel process for creating the porous dielectric layer is disclosed, which can be completed at vacuum or ambient pressures, yet results in porosity, pore size, and shrinkage of the dielectric during drying comparable to that previously attainable only by drying gels at supercritical pressure.

8 Claims, 3 Drawing Sheets

POROUS COMPOSITES AS A LOW DIELECTRIC CONSTANT MATERIAL FOR ELECTRONICS APPLICATIONS

This is a division, of application Ser. No. 08/255,157, filed Jun. 07, 1994, now U.S. Pat. No. 5,494,858.

CROSS-REFERENCE TO RELATED APPLICATIONS

The following co-assigned U.S. patent applications are hereby incorporated herein by reference:

| TI Case | Ser. No. | Filing Date | Inventor | Title |
|---|---|---|---|---|
| TI-18941 | 08/247,195 | 5/20/94 | Gnade et al | A Low Dielectric Constant Material For Electronics Applications |
| TI-19072 | 08/246,432 | 5/20/94 | Havemann et al | Interconnect Structure with an Integrated Low Density Dielectric |
| TI-19253 | 08/250,142 | 5/27/94 | Havemann et al | Two-Step Metal Etch Process For Selective Gap Fill of Submicron Interconnects and Structure For Same |

FIELD OF THE INVENTION

This invention relates generally to the fabrication of dielectrics on semiconductor devices, and more particularly to methods for reducing capacitive coupling on a semiconductor device using electrical insulators made of porous dielectric materials.

BACKGROUND OF THE INVENTION

Semiconductors are widely used in integrated circuits for electronic devices such as computers and televisions. These integrated circuits typically combine many transistors on a single crystal silicon chip to perform complex functions and store data. Semiconductor and electronics manufacturers, as well as end users, desire integrated circuits which can accomplish more in less time in a smaller package while consuming less power. However, many of these desires are in opposition to each other. For instance, simply shrinking the feature size on a given circuit from 0.5 microns to 0.25 microns can increase power consumption by 30%. Likewise, doubling operational speed generally doubles power consumption. Miniaturization also generally results in increased capacitive coupling, or crosstalk, between conductors which carry signals across the chip. This effect both limits achievable speed and degrades the noise margin used to insure proper device operation.

One way to diminish power consumption and crosstalk effects is to decrease the dielectric constant of the insulator, or dielectric, which separates conductors. Probably the most common semiconductor dielectric is silicon dioxide, which has a dielectric constant of about 3.9. In contrast, air (including partial vacuum) has a dielectric constant of just over 1.0. Consequently, many capacitance-reducing schemes have been devised to at least partially replace solid dielectrics with air.

U.S. Pat. No. 4,987,101, issued to Kaanta et al., on Jan. 22, 1991, describes a method for fabricating gas (air) dielectrics, which comprises depositing a temporary layer of removable material between supports (such as conductors), covering this with a capping insulator layer, opening access holes in the cap, extracting the removable material through these access holes, then closing the access holes. This method can be cumbersome, partially because it requires consideration of access hole locations in the design rules and alignment error budget during circuit design, as well as requiring extra processing steps to create and then plug the holes. This method may also create large void areas which have essentially no means of handling mechanical stress and heat dissipation.

U.S. Pat. No. 5,103,288, issued to Sakamoto, on Apr. 7, 1992, describes a multilayered wiring structure which decreases capacitance by employing a porous dielectric with 50% to 80% porosity (porosity is the percentage of a structure which is hollow) and pore sizes of roughly 5 nm to 50 nm. This structure is typically formed by depositing a mixture of an acidic oxide and a basic oxide, heat treating to precipitate the basic oxide, and then dissolving out the basic oxide. Dissolving all of the basic oxide out of such a structure may be problematic, because small pockets of the basic oxide may not be reached by the leaching agent. Furthermore, several of the elements described for use in the basic oxides (including sodium and lithium) are generally considered contaminants in the semiconductor industry, and as such are usually avoided in a production environment. Creating only extremely small pores (less than 10 nm) may be difficult using this method, yet this requirement will exist as submicron processes continue to scale towards a tenth of a micron and less.

Another method of forming porous dielectric films on semiconductor substrates (the term "substrate" is used loosely herein to include any layers formed prior to the conductor/insulator level of interest) is described in U.S. Pat. No. 4,652,467, issued to Brinker et al., on Mar. 24, 1987. This patent teaches a sol-gel technique for depositing porous films with controlled porosity and pore size (diameter), wherein a solution is deposited on a substrate, gelled, and then cross-linked and densified by removing the solvent through evaporation, thereby leaving a porous dielectric. This method has as a primary objective the densification of the film, which teaches away from low dielectric constant applications. Dielectrics formed by this method are typically 15% to 50% porous. with a permanent film thickness reduction of at least 20% during drying. The higher porosities (e.g. 40%–50% ) can only be achieved at pore sizes which are generally too large for such microcircuit applications. These materials are usually referred to as xerogels. although the final structure is not a gel, but an open-pored (the pores are generally interconnected, rather than being isolated cells) porous structure of a solid material.

SUMMARY OF THE INVENTION

The present invention provides methods and structures for creating porous dielectric layers with a tailored porosity profile for use as semiconductor insulators. It is recognized herein that extremely porous dielectric layers (porosity generally greater than 50% and preferably greater than 75%) may provide a dielectric constant approaching 1. A heretofore unrecognized problem in employing such a dielectric layer in an actual device is bonding the porous structure to surrounding structures. The degree of porosity generally relates to a reduction in bond strength (compared to a solid dielectric layer of a similar composition) because of reduced contact area. This can make the interface between a porous and a non-porous layer weaker (and therefore more likely to fail) than the porous structure itself.

Another heretofore unrecognized, but related, problem with such porous layers is the fragility of an exposed surface of the layer, making it prone to surface breakage. Even slight breakage may be problematic in microcircuit applications, since this creates particles which may contaminate a device and hinder proper operation. Both of the stated problems may be mitigated by the present invention, which provides for a porous dielectric layer which is strong at top and/or bottom interface points, yet provides an extremely porous core for capacitive coupling reduction. Because all of the porous sublayers may be dried in a single drying step using the present invention, only the top sublayer is ever subjected to the environment in a dried state. Furthermore an unexpected benefit of bonding porous sublayers at the time of gelation is a much stronger gel-to-gel bond than if each layer were gelled and dried separately. It may be preferable in many applications of the present invention to tailor neighboring sublayers to differ in porosity by at least 20%, in order to effect the desired structural and/or low dielectric properties of the composite porous dielectric layer. Generally, sublayers of 15% to 50% porosity are preferable for structural support, while sublayers of greater than 50% porosity are preferable for low dielectric constant sublayers (greater than 75% porosity is more preferable).

The present invention provides a method of forming a porous dielectric on a semiconductor device which may include providing a patterned layer formed on a substrate. The patterned layer may be strictly a layer of conductors, or a composite of conducting and insulating sublayers. The method may further comprise providing a solution or solutions capable of forming a wet gel, and coating the substrate with and gelling one or more applications of solution. Multiple wet gel sublayers may, by employing varying solution compositions or altering the gelling conditions at each sublayer, possess inherently different porosities. The method may further comprise drying the wet gel in a controlled manner to produce porosity gradients within the porous dielectric. The controlled drying may, for example, employ two or more solvents of differing volatility, and controlled evaporation such that the ratio of the solvents present in the wet gel changes during drying. The controlled evaporation may include individually controlling partial pressures of the solvents in the drying atmosphere. An alternate method of controlled drying may include varying the temperature of the wet gel during drying to alter the surface tension and/or other properties of the pore fluid.

The present invention can also provide structures for decreasing capacitive coupling on semiconductor devices, comprising a patterned layer formed on a substrate and a porous dielectric layer deposited at least in the gaps present in the patterned layer. The porous dielectric layer may be comprised of at least two porous dielectric sublayers, with pairs of porous sublayers which share a common transition region differing in porosity by at least 20%. Preferably, the pores in the porous dielectric have an average pore diameter of less than 80 nm (more preferably between 2 nm and 25 nm). The patterned layer may be strictly a layer of conductors, or a composite of conducting and insulating sublayers. The porous sublayers may be demarcated by a fairly distinct transition, or by a more gradual, graded transition. The structure may further comprise a non-porous dielectric layer deposited over layer.

BRIEF DESCRIPTION OF THE DRAWINGS

This invention, including various features and advantages thereof, can be best understood by reference to the following drawings, wherein.

DETAILED DESCRIPTION OF THE PREFERRED EMBODIMENTS

Figure 1A:
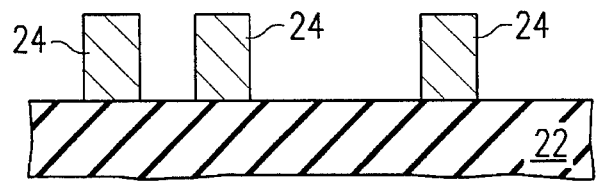
FIGS. 1 A–1D illustrate cross-sections of a portion of a semiconductor device, illustrating several steps in the application of an embodiment of the invention to a typical device.
Figure 1B:
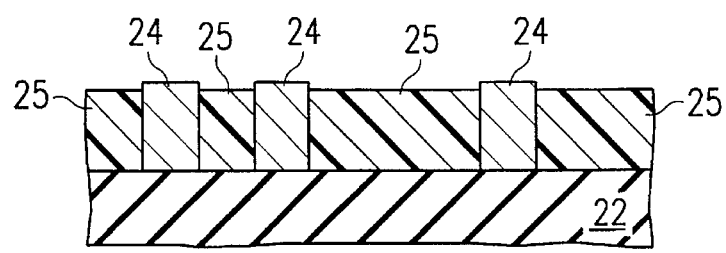
Figure 1C:
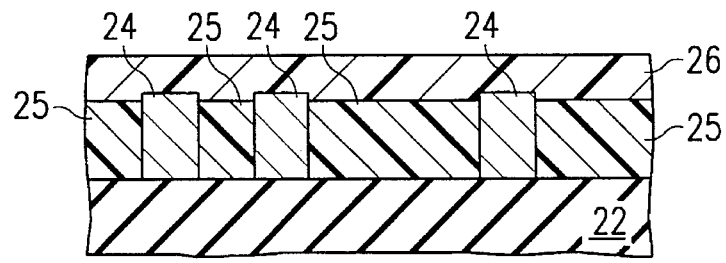

As an introduction, FIGS. 1A–1D illustrate a semiconductor structure at several steps in a typical embodiment of the method of the invention. In FIG. 1A, three patterned conductors 24 (e.g. of aluminum alloyed with a small amount of copper) are shown formed on an insulating layer 22, which may contain vias or through holes (not shown) for providing electrical contact between conductors 24 and lower layers of the device. In FIG. 1B, a gel precursor solution (some of which are described in detail in the specific chemical examples) is shown after disposition and gelling in the gaps between conductors 24 to form a first wet gel sublayer 25. The method of application may be, for example, a spin-on technique in a controlled atmosphere which limits solvent evaporation. The precursor may be prepared, for example, by the following 2-step process. First, TEOS stock, a mixture of tetraethylorthosilicate (TEOS), ethanol, water, and HCl, in the approximate molar ratio 1:3:1:0.0007, is prepared by stirring these ingredients under constant reflux at 60 degrees C. for 1.5 hours. Secondly, 0.05M ammonium hydroxide is added to the TEOS stock, 0.1 ml for each ml of TEOS stock. Since the addition of the ammonium hydroxide to the stock greatly increases gelation rate, the solution must be quickly applied to the wafer (it may be possible to switch the order of these two steps). After the solution is applied to the wafer, care should be taken to insure that the thin film does not dry prematurely; preferably, the wafer containing the solution/gel remains immersed either in liquid or in a saturated atmosphere at all times prior to the drying stage. The precursor solution may preferably be gelled on the substrate, a process which typically takes from 1 minute to 12 hours, depending on the solution and method of gelling. The first wet gel can be allowed time to age, generally about a day (although it may be much shorter), at one or more controlled temperatures. Gelation and aging may preferably be accomplished by letting the device sit in a saturated ethanol atmosphere for approximately 24 hours at about 37 degrees C. In FIG. 1C, a second application of a gel precursor solution (which may possibly be identical to the first precursor solution) is deposited and gelled over first wet gel sublayer 25 to form second wet gel sublayer 26. By subjecting the first and second sublayers to different gelling/aging conditions, the respective porosities of the two layers may be varied. Alternately, different solvent ratios may be used in the precursor solutions to adjust the respective porosities.

Figure 1D:
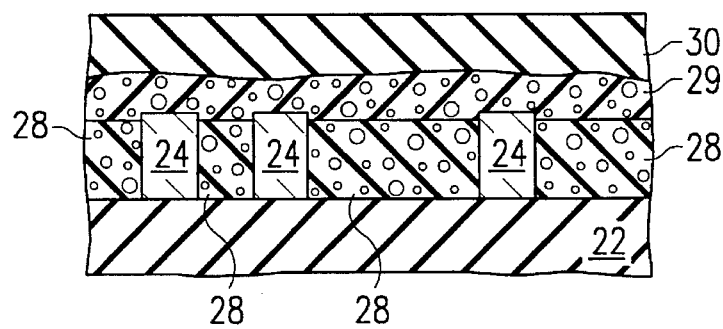

First and second wet gel sublayers 25 and 26 are dried to produce first and second porous dielectric sublayers 28 and 29, as shown in FIG. 1D. An important aspect of the invention illustrated herein is that first wet gel sublayer 25 may be dried through the overlying sublayer, since a continuous open-pored structure (and drying path) is maintained above the drying front (The drying front is the boundary between liquid and vapor phases of the pore fluid in the wet gel). Finally, depending on the porosity and thickness selected for sublayer 29, it may be preferable to follow the drying process with deposition of non-porous dielectric layer 30. This layer may preferably be composed of silicon dioxide deposited by a chemical vapor deposition (CVD) technique.

As one specific example of porosity tailoring, the porosities of sublayers 28 and 29 may be selected to be approximately 80% and 30%, respectively. The 80% porosity sublayer may form a dielectric region between conductors 24 with an extremely low (k<1.5) dielectric constant. However, if this same layer were subjected to handling after deposition, extremely thin pore walls (less than 10 atoms across in many places) near the surface may be susceptible to breakage and formation of particulate contaminants. By capping the 80% porous layer with, and drying it through, the denser top sublayer, fragility and breakage problems are generally avoided.

The process of drying a wet gel involves evaporation of pore fluid along the current drying front. A phase change (from liquid to vapor) exists in the pores along the drying front, with the liquid pore fluid forming a meniscus (a generally crescent-shaped boundary between liquid pore fluid and vapor formed during evaporation). The meniscus is an indication of the surface tension of the pore fluid exerting an inward (usually, although some fluids can exert outward) pressure on the walls of the pore. This capillary pressure P can be related to the pore fluid surface tension $T_s$, the contact angle q (the angle at which the fluid meniscus contacts the surface of the pore), and the pore radius r, by the equation $$P = \frac{2T_s \cos q}{r} \quad (1)$$

During drying, a gel generally shrinks to a point where P is in equilibrium with the strength of the gel. This shrinkage is one factor in determining the final porosity of a dried gel. Thus many of the techniques developed herein modify either the surface tension, contact angle, or pore radius to achieve desired porosity tailoring effects. However, it has been recognized that gel shrinkage during drying in general can cause a multitude of undesirable effects in microcircuit applications.

To circumvent the capillary pressure problem in monolithic xerogel synthesis, the aerogel technique has been developed. Generally, this variation of the xerogel technique removes a solvent from a wet gel under supercritical pressure and temperature conditions. By removing the solvent in the supercritical region, vaporization of the liquid solvent does not take place; instead, the fluid undergoes a constant change in density during the operation, changing from a compressed liquid to a superheated vapor with no distinguishable state boundary. This technique avoids the capillary pressure problem entirely, since no state change boundaries ever exist in the pores. Adapting the aerogel technique to semiconductor fabrication appears to be problematic and expensive; typical solvent candidates have high critical pressures (e.g. ethanol, 924 psi, carbon dioxide, 1071 psi) which make application difficult in most circumstances. For instance, these pressures may tend to crush previous layers of porous dielectric capped under atmospheric pressure or force the wet gel into the pores of previous porous dielectric layers left uncapped, and may require containment of the wet gel at the edges of the wafer to prevent the gel from being squeezed off the wafer before the gel can be dried. Nevertheless, a highly porous, finely pored dielectric structure may be formed by this process under some conditions, making this supercritical technique possibly useful in the practice of the present invention.

As an alternative to this, the present invention includes a group of novel techniques which may be applied at a range of pressures from vacuum to near-critical, with atmospheric pressure being preferable due to ease of handling and compatibility with previous porous layers. One similarity in these techniques is that a surface modification step is performed on the wet gel, replacing a substantial number of the molecules on the pore walls with those of another species. This surface modification typically replaces reactive surface groups such as hydroxyls and alkoxyls with more stable surface groups such as methyl groups, thereby controlling undesirable condensation reactions (and shrinkage effects) during gel drying. It has been discovered that by controlling the percentage of reactive surface groups replaced during the surface modification, the final shrinkage may be adjusted from the large shrinkage typical of an unmodified xerogel (with uncontrolled shrinkage) to a shrinkage of only a few percent, heretofore only achievable with a supercritical aerogel technique. Typically, approximately 30% of the reactive surface groups must be replaced to substantially alleviate densification. Furthermore, the replacement surface species may be chosen because of its wetting properties in combination with specific pore fluids; the surface modification may result in a pore fluid contact angle closer to 90 degrees. As the fluid contact angle approaches 90 degrees, the cosine of the contact angle q goes to 0, and the capillary pressure P of Equation 1 is reduced proportionally. It is believed that the surface modification prevents surface condensation reactions, and may also reduce capillary pressure by changing pore fluid contact angle, thereby allowing pores in the surface modified gel to better survive drying. This novel technique can produce a dielectric layer, at atmospheric pressure, with average pore diameter, porosity, and overall shrinkage resembling those of supercritically-dried aerogels.

An additional benefit of the surface modification can be hydrophobicity. It has been found that, for example, replacing only 15% of the reactive surface groups with methyl groups may be sufficient to cause the structure to be hydrophobic. This is an important feature for any material used in semiconductor processing, but particularly so for porous materials. If the porous surfaces are left hydrophilic (water-wanting), the structure is in many ways analogous to a common household sponge, which may hold many times its weight in water. However, the extremely small pore sizes allow a hydrophilic porous dielectric to rapidly gather water out of the surrounding air, the prevention of which would be an added difficulty during device fabrication. By making the pores hydrophobic before the gel is dried, these types of difficulties may be avoided.

Figure 2:
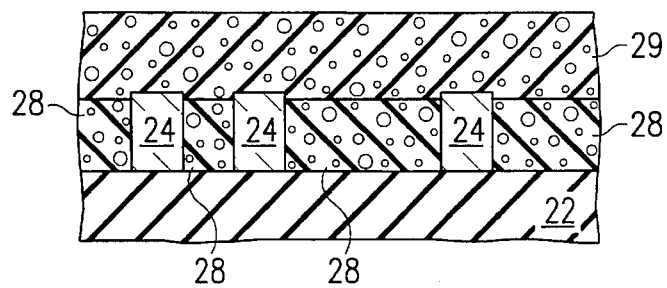
FIG. 2 shows a cross-sectional illustration of a second embodiment which does not include a non-porous top layer.

In accordance with the present invention, FIG. 2 shows a second embodiment where the porous structure acts as both interlayer and intralayer dielectric. In this example, shrinkage is controlled during drying of porous sublayer 28, but uncontrolled (or controlled but allowed significant densification) for porous sublayer 29. After gelation and aging of a first wet gel (e.g. FIG. 1B), the water may be removed from the wet gel, preferably by immersing the wafer in pure ethanol. A surface modification step may then be performed, preferably by immersing the wafer in a hexane solution containing about 10% by volume trimethylchlorosilane (TMCS). After a brief reaction time, the unreacted surface modification compound is usually removed by immersing the wafer in an aprotic solvent (e.g. acetone, hexane) and allowing excess solvent to drain. After this solvent exchange a process similar to that of FIG. 1C may be used to deposit a second wet gel above the now surface-modified first wet gel. If the second sublayer is left substantially unmodified, it may densify significantly during drying, while the modified underlying sublayer may remain substantially undensified. For example, porous sublayer 29 may only be 20% porous, while porous sublayer 28 may have a porosity greater than 75%. If sublayer 29 extends far enough above conductors 24 and is fairly dense, it may be entirely suitable as an interlayer dielectric.

Figure 3A:
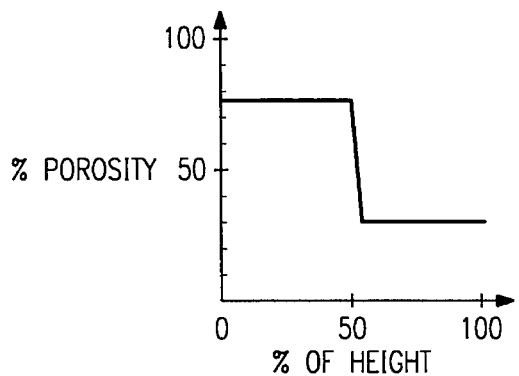
FIGS. 3A, 3B, 3C, and 3D contain graphs which illustrate porosity profiles for several possible embodiments of the invention.
Figure 3B:
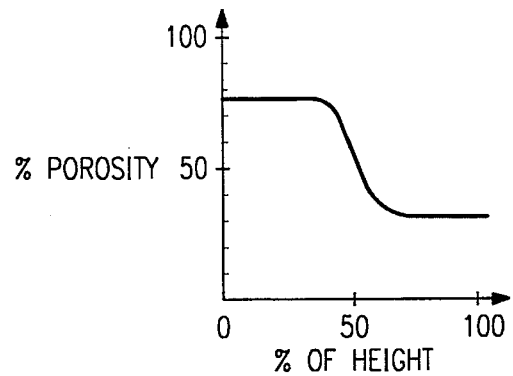
Figure 3C:
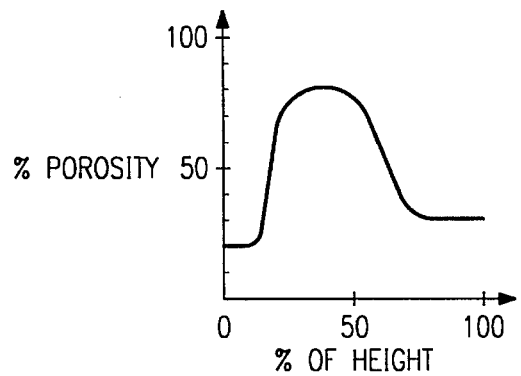
Figure 3D:
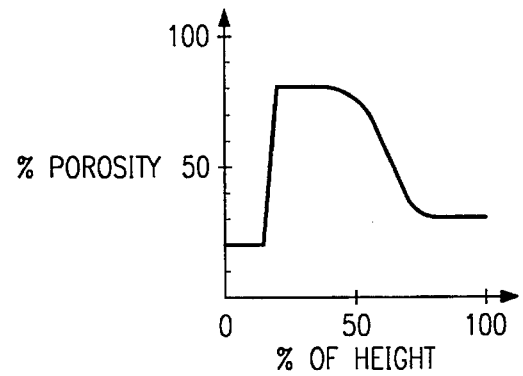

The embodiments shown above include processes which use successive wet gel sublayer formation, with each layer tailored individually. Other possible embodiments regulate the porosity profile of what is initially a single wet gel sublayer or layer to create similar effects. It is also possible to combine these two approaches in a single embodiment. FIG. 3A illustrates a typical porosity profile for a two successive sublayer approach. FIG. 3B illustrates a similar profile obtained with a regulated single sublayer. Typically, this approach results in a broader, more gradual transition region between porosities than the successive sublayer approach. FIG. 3C shows a third porosity profile which is regulated to produce a highly porous core "sandwiched" between two denser sublayers. FIG. 3D is similar, but with a combination of approaches, where the first dense sublayer is gelled separately, and the porous core and second dense sublayer are formed from the same gel deposition.

Several techniques may be used separately, or combined, to control the final porosity profile of a gel deposition. One technique involves temperature-controlled drying. As drying proceeds, the temperature of the device containing the gel is varied. The temperature directly affects the surface tension of the liquid pore fluid, and therefore the capillary pressure and shrinkage along the drying front. For example, drying may be initiated on a gel wetted with butanol, at an initial temperature of 0 degrees C. At some point, the temperature may be raised to 110 degrees C. and drying continued. Because the surface tension of butanol is about 50% higher at the cooler temperature, the upper portion of the gel may tend to shrink more than the lower portion, with a transition region corresponding to the location of the drying front at the time of the temperature change.

A second technique is to wet the gel with a mixture of pore fluids which preferably have different volatility, and different surface tension and/or contact angle characteristics. As drying proceeds, the ratio of pore fluids changes as the higher volatility fluid tends to evaporate first. This causes a porosity profile to develop which is representative of the relative concentration of the fluids. It is possible to select fluids to give either a low-to-high porosity transition, or viceversa. For example, water ($T_s$=72 dyne/cm at 25 C, b.p.=100 C) may be mixed with butanol ($T_s$=24 dyne/cm at 25 C, b.p.=117 C) to achieve a structure which is more porous on bottom, with the relative volumes of the two liquids determining the location of the transition point. Or water may be mixed with ethanol ($T_s$=22 dyne at 25 C, b.p.=78.5 C) to achieve the opposite effect. Three fluids may be combined to achieve a three-layer effect.

Figure 4:
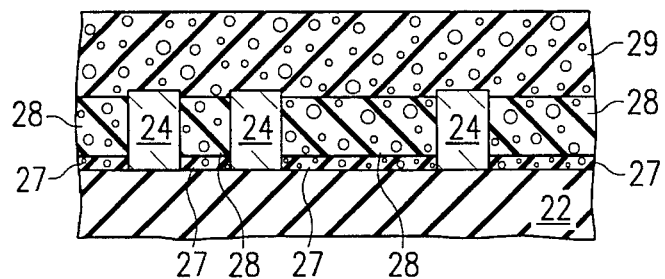
FIG. 4 shows a cross-section of another semiconductor device with three porosity regions.
Figure 5:
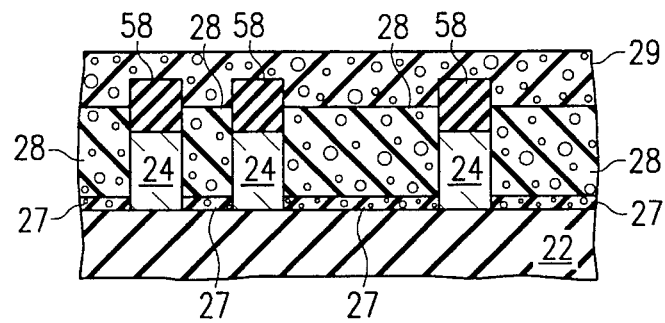
FIG. 5 shows a cross-section of another structure with dielectric spacers affixed to the tops of conductors.
Figure 6:
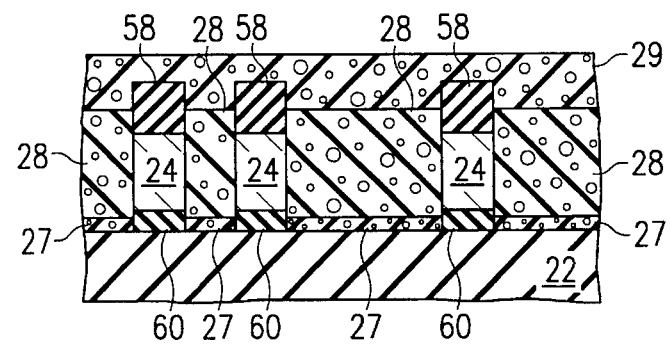
FIG. 6 shows a cross-sections of yet another semiconductor device with three porosity regions and dielectric spacers affixed both to the tops and bottoms of conductors.

In accordance with the porosity profile of FIG. 3C or 3D, the structural embodiments of FIGS. 4–6 are included. FIG. 4 illustrates a three-sublayer porous dielectric structure, where sublayer 27 may be a dense sublayer and sublayer 28 a highly porous sublayer, with these two sublayers essentially filling the intraconductor gaps (between conductors 24). Sublayer 29 may be. e.g., a second dense sublayer which completes an interlayer dielectric. This structure provides the benefits of good bottom adherence (between sublayer 27 and insulating layer 22, a low dielectric constant material between conductors 24 (sublayer 28), and a relatively solid top sublayer 29 to add strength and protection for the more fragile core sublayer 28.

FIG. 5 illustrates an embodiment wherein dielectric top spacers 58 are formed on top of conductors 24, before formation of porous sublayers. This may be accomplished by depositing a conducting film (e.g. aluminum alloyed with a small amount of copper) over insulating layer 22, depositing an overlying insulating film (e.g. of silicon dioxide), and patterning both from one photoresist mask. In this arrangement, the positioning of the transition region between porous sublayers 28 and 29 is not as critical as that of FIG. 5. By preferably attempting to center this transition region midway down top spacers 58, intralayer capacitance may be more tightly controlled, capacitive fringing effects through sublayer 29 may be reduced and better contact between the patterned layer and sublayer 29 may be effected.

FIG. 6 shows an embodiment which builds on that of FIG. 5, by adding dielectric bottom spacers 60 to the patterned layer. Because conductors 24 are most likely electrically connected through vias to lower layers of the device, this layer is preferably initially formed and patterned as part of insulating layer 22. However, by using a technique such as an etch selective hard mask as an upper sublayer of insulating layer 22 (e.g. a top portion of 22 formed of silicon nitride, with an underlying silicon dioxide layer), it may be possible to remove portions of the hard mask lying between conductors 24 (after etching the conducting layer, using the conductors as a mask), leaving bottom spacers 60 disposed beneath conductors 24. In this embodiment, a dense porous sublayer 27 may be effectively "dropped" below the level of conductors 24, further lowering capacitance and reducing capacitive fringing effects through a denser sublayer 27.

Figure 7:
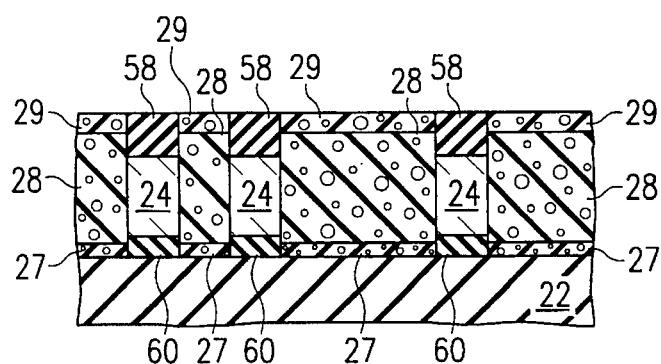
FIG. 7 shows the device of FIG. 6, after removal of a top portion of the upper layers.

Finally, FIG. 7 shows the structure of FIG. 6, but with a top portion of porous sublayer 29 (and possibly a top portion of top spacers 58) removed. This may be preferable if via etching through only solid layers is desired, and/or further planarization of the top surface is desired. The removal of a top portion of sublayer 29 may be implemented by a controlled chemical etch or by a mechanical polishing step.

The following table provides an overview of some embodiments cross-referenced to the drawings.

| Drawing Element | Preferred or Specific Examples | Generic Term | Other Alternate Examples |
| --- | --- | --- | --- |
| 22 | Previous interlayer dielectric | Insulating layer | Previously-formed layers of a semiconductor device, substrate |
| 24 | AlCu alloy | Conductors | Al, Cu, Mo, W, Ti, |

-continued

| Drawing Element | Preferred or Specific Examples | Generic Term | Other Alternate Examples |
|---|---|---|---|
| | and/or refractory metal | | and alloys of these Polysilicon, silicides, nitrides, carbides |
| 25, 26 | TEOS stock | Precursor solution | Solution of particulate or colloidal silicon, germanium, titanium, aluminum silicate ratioed TEOS/ MTEOS (methyltriethoxysilane) stock, ratioed TEOS/ BTMSE (1,2-Bis(trimethoxysilyl)-ethane) stock |
| 27, 28, 29 | Surface-modified dried gel | Porous dielectric sublayer | Supercritically-dried aerogel, other fine-pored porous dielectrics |
| 30 | Silicon dioxide | Non-porous dielectric layer | Other oxides, B or P-doped $SiO_2$, silicon nitride, silicon oxynitride Parylene, polyimides, organic-containing oxide |
| 58 | Silicon dioxide | Dielectric top spacers | Silicon nitride, silicon oxynitride, organic-containing oxide |
| 60 | Silicon nitride | Dielectric bottom spacers | Same as non-porous dielectric layer |

The invention is not to be construed as limited to the particular examples described herein, as these are to be regarded as illustrative, rather than restrictive. The invention is intended to cover all processes and structures which do not depart from the spirit and scope of the invention. For example, one skilled in the art could apply one of the many other published methods of initially forming a wet gel from an appropriate precursor to this invention. Alternately, one could substitute organics for a portion of the silica while, for example, still having a material which was principally silica (less than 50 atom percent of the silicon being replaced). A post-bake of the dried porous layer, e.g. at 100 to 450 degrees C. in a reducing atmosphere, may be performed prior to deposition of any dense cap layers. Passivation coatings deposited as a relatively thin layer over conductors may also be added to any of the embodiments given herein. Properties of some of the specific examples may be combined without deviating from the nature of the invention.

What is claimed is:

1. A semiconductor device which comprises:
   (a) a patterned layer formed on a substrate, said patterned layer having at least one present therein: and
   (b) a porous dielectric layer deposited in said at least one gap and having a first thickness, said porous dielectric layer comprised of at least two porous dielectric sublayers, pairs of said sublayers which share a common transition region differing in porosity by at least 20%, said porous dielectric layer having average pore diameters of less than 80 nm, whereby an extremely porous dielectric sublayer with a dielectric constant less than 2.0 may be effectively adhered to said semiconductor device and particle contamination from breakage of an extremely porous sublayer may be avoided.

2. The semiconductor device of claim 1, wherein said porous dielectric layer comprises top and bottom porous dielectric sublayers sharing a common transition region, said top porous sublayer having a porosity in the range of 15% to 50%, said bottom porous sublayer having a porosity greater than 50%.

3. The semiconductor device of claim 1, wherein said porous dielectric layer comprises top, middle, and bottom porous dielectric sublayers, said top and bottom porous sublayers having porosities in the range of 15% to 50%, said middle porous sublayer having a porosity greater than 50%, said middle and bottom porous sublayers sharing a first common transition region, and said top and middle porous sublayers sharing a second common transition region.

4. The semiconductor device of claim 1, wherein said common transition regions have a gradual change in porosity.

5. The semiconductor device of claim 1, wherein said common transition regions occupy at least half of said first thickness of said porous dielectric layer.

6. The semiconductor device of claim 1, further comprising a non-porous dielectric layer covering said porous dielectric layer.

7. The semiconductor device of claim 1, wherein said patterned layer comprises conductors constructed from materials selected from the group consisting of: aluminum, copper, titanium, platinum, gold, tungsten, polysilicon, tantalum, nickel, TiN, $TiSi_2$, and combinations thereof.

8. The semiconductor device of claim 7, wherein said patterned layer further comprises at least one dielectric sublayer.

* * * * *